United States Patent
Hsu et al.

(10) Patent No.: US 8,204,731 B2
(45) Date of Patent: Jun. 19, 2012

(54) SIGNAL ANALYZING METHOD FOR ELECTRONIC DEVICE HAVING ON-CHIP NETWORK AND OFF-CHIP NETWORK

(75) Inventors: Hsing-Chou Hsu, Tainan County (TW); Tung-Yang Chen, Tainan County (TW)

(73) Assignee: Himax Technologies Limited, Fonghua Village, Xinshi Dist., Tainan (TW)

( * ) Notice: Subject to any disclaimer, the term of this patent is extended or adjusted under 35 U.S.C. 154(b) by 216 days.

(21) Appl. No.: 12/714,561

(22) Filed: Mar. 1, 2010

(65) Prior Publication Data

US 2011/0213604 A1 Sep. 1, 2011

(51) Int. Cl.
G06F 17/50 (2006.01)
(52) U.S. Cl. ......................................... 703/14
(58) Field of Classification Search .......... 703/2, 13–16; 370/389, 458; 711/110; 710/105, 316
See application file for complete search history.

(56) References Cited

U.S. PATENT DOCUMENTS

| | | | | |
|---|---|---|---|---|
| 7,373,449 B2 * | 5/2008 | Radulescu et al. | ............ | 710/316 |
| 7,594,052 B2 * | 9/2009 | Radulescu et al. | ............ | 710/105 |
| 7,873,066 B2 * | 1/2011 | Muff et al. | ..................... | 370/429 |
| 2007/0164887 A1* | 7/2007 | Truong et al. | ................. | 341/154 |
| 2007/0186018 A1* | 8/2007 | Radulescu et al. | ............ | 710/100 |
| 2008/0267211 A1* | 10/2008 | Gangwal et al. | .............. | 370/458 |
| 2009/0016340 A1* | 1/2009 | Eberle | ........................... | 370/389 |

OTHER PUBLICATIONS

Bjerregaard et al, A Survey of Research and Practices of Network-on-Chip, ACM Computing Surveys, vol. 3, No. 1, Mar. 2006, pp. 1-51.*

Darringer et al, Early Analysis Tools for System-on-a-Chip Design, IBM Journal of Research and Development, vol. 46, No. 6, Nov. 2002, pp. 691-707.*

* cited by examiner

*Primary Examiner* — Russell Frejd
(74) *Attorney, Agent, or Firm* — Winston Hsu; Scott Margo

(57) ABSTRACT

The present invention provides a signal analyzing method for an electronic device having an on-chip network and an off-chip network. Compared with the conventional signal analyzing method for an electronic device having an on-chip network and an off-chip network, the signal analyzing method of the present invention is able to provide a complete electrical connection and accurate electrical characteristics for an electronic device having an on-chip network and an off-chip network.

2 Claims, 6 Drawing Sheets

SIGNAL ANALYZING METHOD FOR ELECTRONIC DEVICE HAVING ON-CHIP NETWORK AND OFF-CHIP NETWORK

BACKGROUND OF THE INVENTION

1. Field of the Invention

The present invention relates to a signal analyzing method, and more particularly, to a signal analyzing method for an electronic device having an on-chip network and an off-chip network.

2. Description of the Prior Art

Please refer to FIG. 1 and FIG. 2. FIG. 1 shows a simplified diagram of a conventional electronic device 100 having an on-chip network 110 and an off-chip network 120. FIG. 2 shows a flowchart of a conventional signal analyzing method for the electronic device 100. As shown in FIG. 1 and FIG. 2, the conventional signal analyzing method comprises the following steps:

Step 200: Define a number X of first power nodes P11~P1x and a number Y of first ground nodes G11~G1y in the on-chip network 110.

Step 210: Define a number X of second power nodes P21~P2x and a number Y of second ground nodes G21~G2y in the off-chip network 120.

Step 220: Utilize a quasi-static electromagnetic simulation to analyze the off-chip network 120.

However, this conventional signal analyzing method is not able to provide accurate electrical characteristics between two different interfaces, because when the method analyzes signals at high frequency, the phases of the signals are not accurate. Please refer to FIG. 3 and FIG. 4. FIG. 3 shows a simplified diagram of a conventional electronic device 300 having an on-chip network 310 and an off-chip network 320. FIG. 4 shows a flowchart of a conventional signal analyzing method for the electronic device 300. As shown in FIG. 3 and FIG. 4, the conventional signal analyzing method comprises the following steps:

Step 400: Define a number X of first power nodes P11~P1x and a number Y of first ground nodes G11~G1y in the on-chip network 310.

Step 410: Utilize a full wave electromagnetic simulation to analyze the off-chip network 320, thereby obtaining a number X of first resultant nodes P21~P2x in the off-chip network 320.

However, this conventional signal analyzing method is not able to provide a complete electrical connection between two different interfaces.

SUMMARY OF THE INVENTION

It is therefore one of the objectives of the present invention to provide a signal analyzing method for an electronic device having an on-chip network and an off-chip network, so as to solve the above problems.

In accordance with an embodiment of the present invention, a signal analyzing method for an electronic device having an on-chip network and an off-chip network is disclosed. The signal analyzing method comprises: defining a number X of first power nodes and a number Y of first ground nodes in the on-chip network, wherein X and Y are positive integers; defining a number X of second power nodes and a number Y of second ground nodes in the off-chip network; assigning one of the first ground nodes as a first reference node; assigning one of the second ground nodes as a second reference node; utilizing a full wave electromagnetic simulation to analyze the off-chip network, thereby obtaining a number (X+Y−1) of first resultant nodes in the on-chip network and a number (X+Y−1) of second resultant nodes in the off-chip network, wherein each of the first resultant nodes is derived from a voltage difference between the first reference node and a corresponding node selected from the first power nodes and the first ground nodes except the first reference node, and each of the second resultant nodes is derived from a voltage difference between the second reference node and a corresponding node selected from the second power nodes and the second ground nodes except the second reference node; and mapping the second resultant nodes in the off-chip network with the first resultant nodes in the on-chip network.

Compared with the conventional signal analyzing method for an electronic device having an on-chip network and an off-chip network, the signal analyzing method disclosed by the present invention is able to provide a complete electrical connection and accurate electrical characteristics for an electronic device having an on-chip network and an off-chip network.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
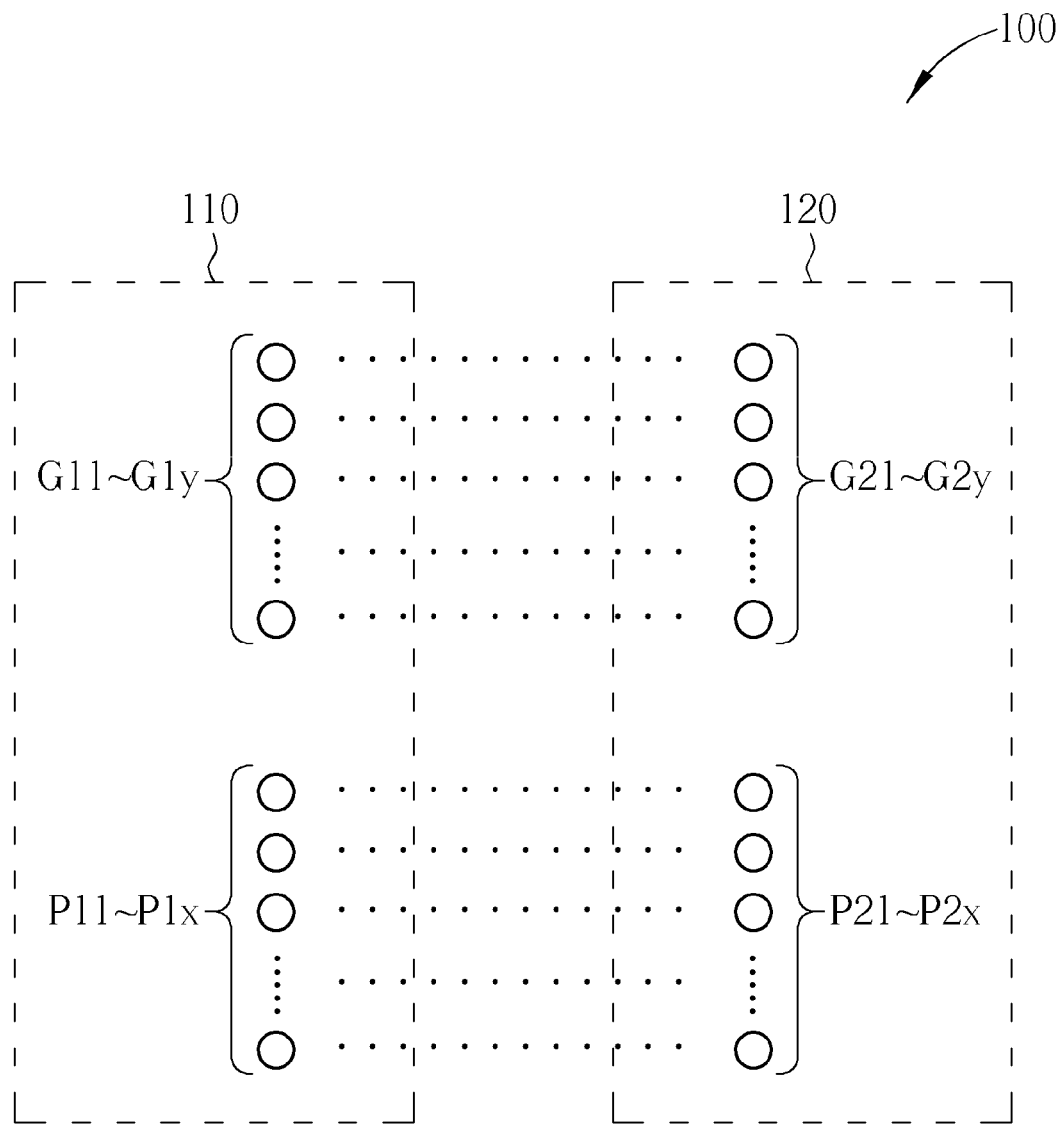
FIG. 1 shows a simplified diagram of a conventional electronic device having an on-chip network and an off-chip network.
Figure 2:
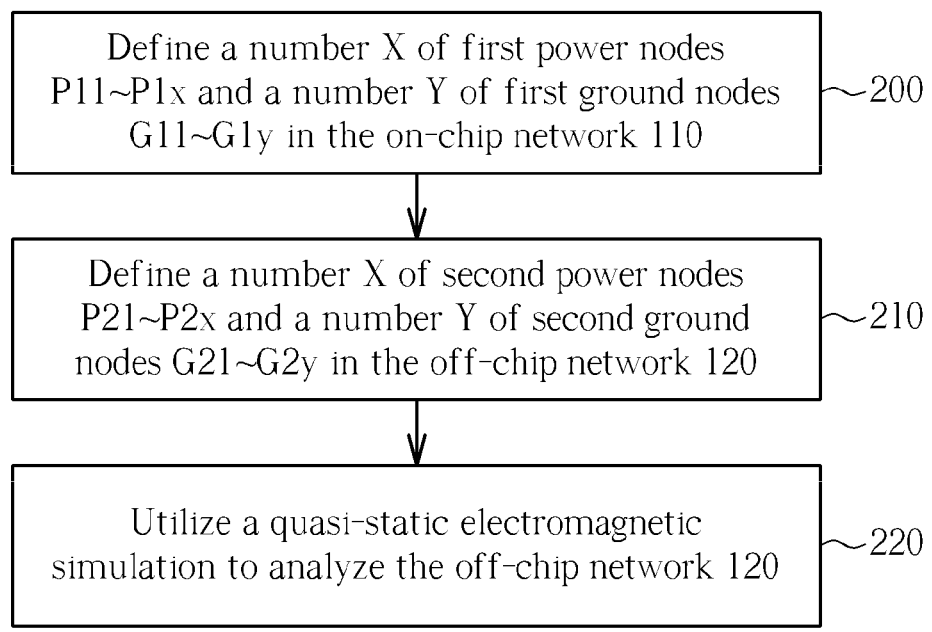
FIG. 2 shows a flowchart of a conventional signal analyzing method for the electronic device.
Figure 3:
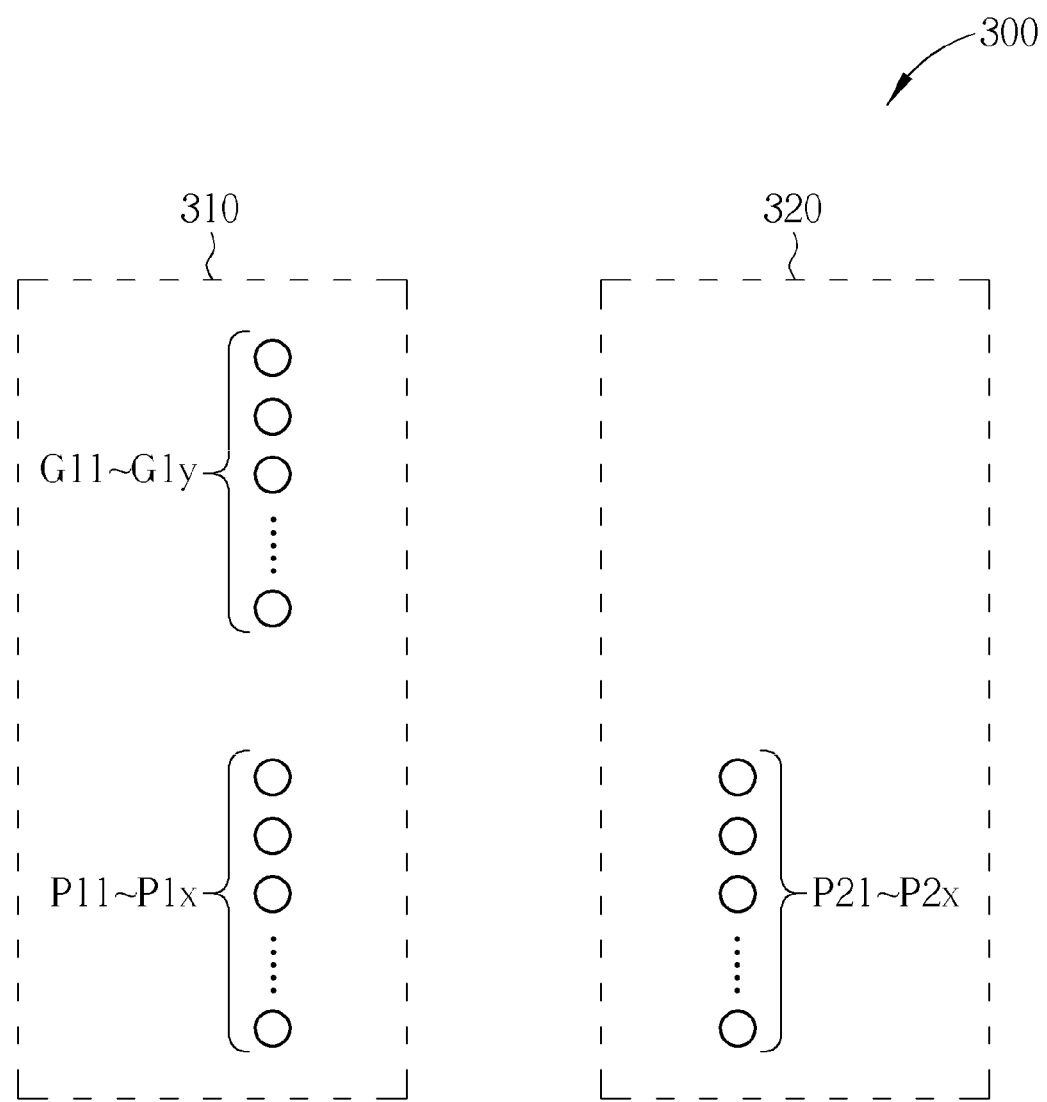
FIG. 3 shows a simplified diagram of a conventional electronic device having an on-chip network and an off-chip network.
Figure 4:
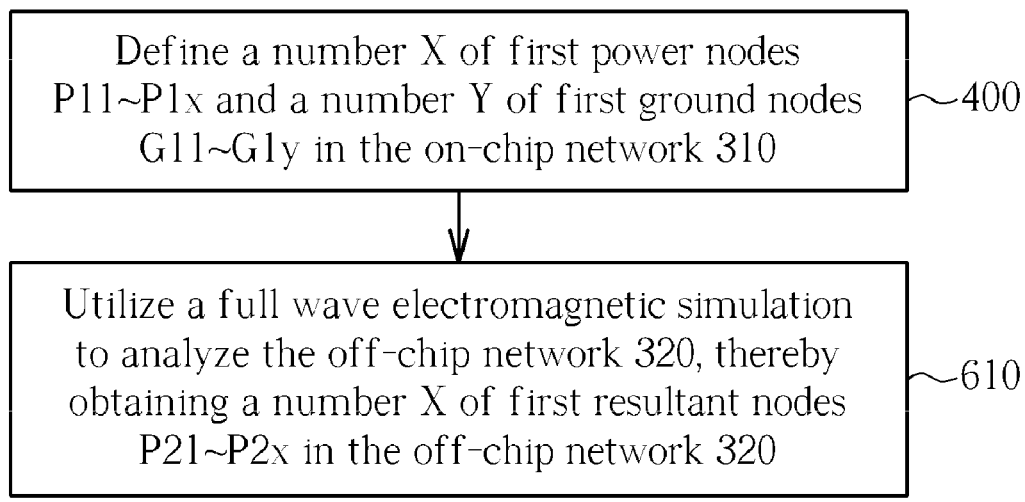
FIG. 4 shows a flowchart of a conventional signal analyzing method for the electronic device.
Figure 5:
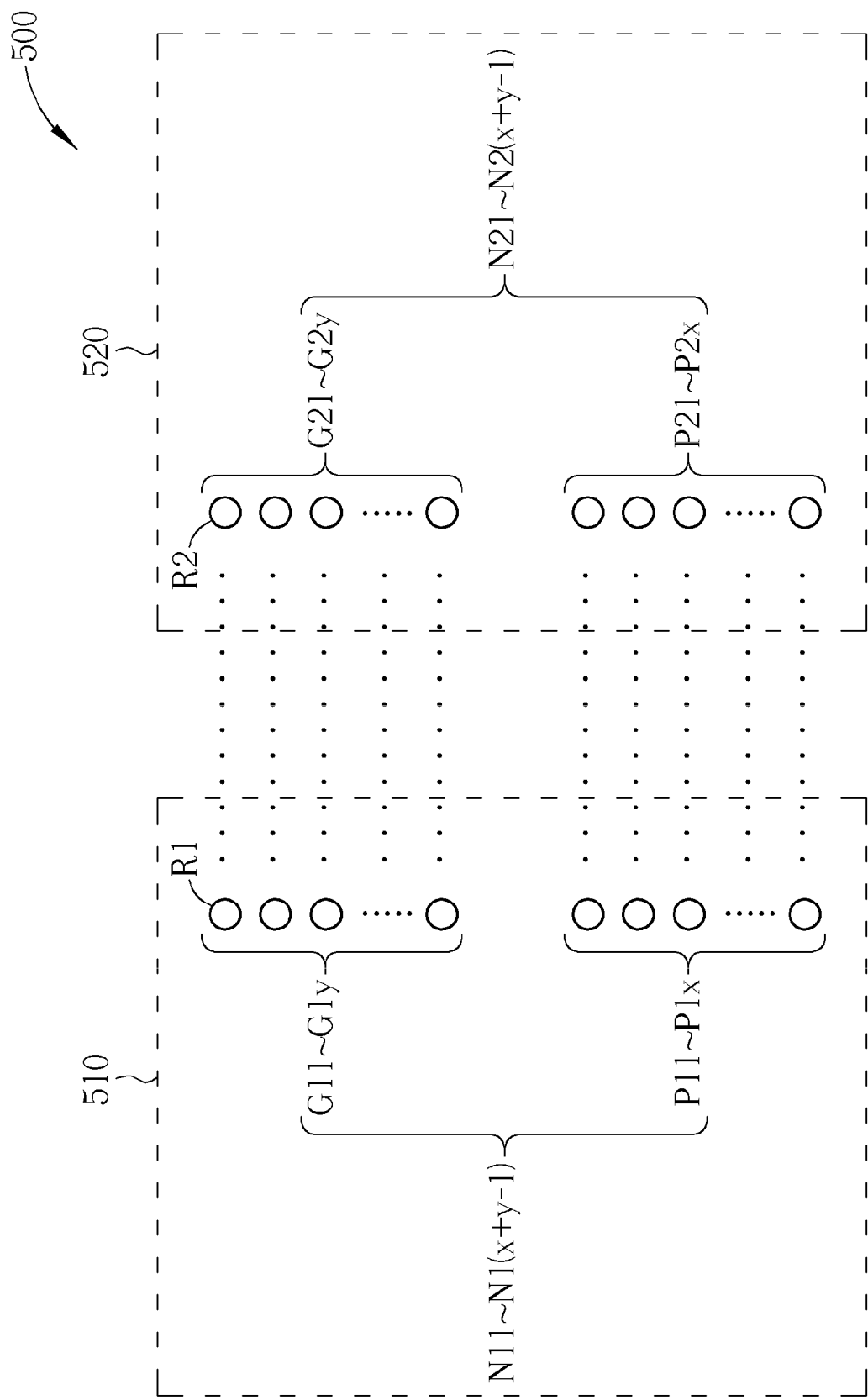
FIG. 5 shows a simplified diagram of an electronic device having an on-chip network and an off-chip network in accordance with an embodiment of the present invention.
Figure 6:
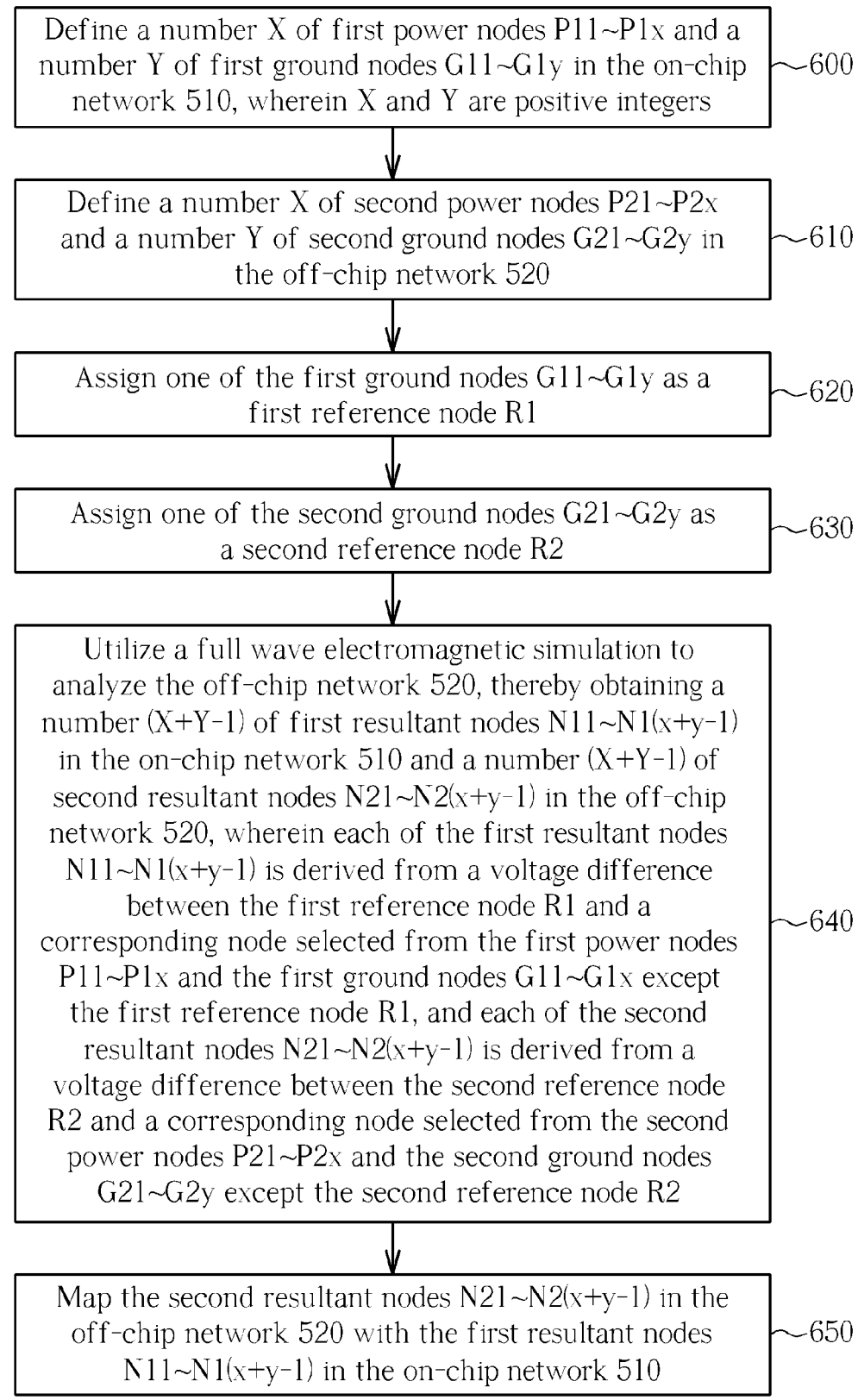
FIG. 6 shows a flowchart of a signal analyzing method for the electronic device.

Please refer to FIG. 5 and FIG. 6. FIG. 5 shows a simplified diagram of an electronic device 500 having an on-chip network 510 and an off-chip network 520 in accordance with an embodiment of the present invention. The on-chip network 510 can be an integrated circuit (IC), and the off-chip network can be a circuit board 520. FIG. 6 shows a flowchart of a signal analyzing method for the electronic device 500. As shown in FIG. 5 and FIG. 6, the signal analyzing method comprises:

Step 600: Define a number X of first power nodes P11~P1x and a number Y of first ground nodes G11~G1y in the on-chip network 510, wherein X and Y are positive integers.

Step 610: Define a number X of second power nodes P21~P2x and a number Y of second ground nodes G21~G2y in the off-chip network 520.

Step 620: Assign one of the first ground nodes G11~G1y as a first reference node R1.

Step 630: Assign one of the second ground nodes G21~G2y as a second reference node R2.

Step 640: Utilize a full wave electromagnetic simulation to analyze the off-chip network 520, thereby obtaining a number (X+Y−1) of first resultant nodes N11~N1(x+y−1) in the on-chip network 510 and a number (X+Y−1) of second resultant nodes N21~N2(x+y−1) in the off-chip network 520, wherein each of the first resultant nodes N11~N1(x+y−1) is derived from a voltage difference between the first reference node R1 and a corresponding node selected from the first power nodes P11~P1x and the first ground nodes G11~G1y except the first reference node R1, and each of the second resultant nodes N21~N2(x+y−1) is derived from a voltage difference between the second reference node R2 and a corresponding node selected from the second power nodes P21~P2x and the second ground nodes G21~G2y except the second reference node R2.

Step 650: Map the second resultant nodes N21~N2(x+y−1) in the off-chip network 520 with the first resultant nodes N11~N1(x+y−1) in the on-chip network 510.

For example, the signal analyzing method of the present invention firstly defines three first power nodes P11~P13 and three first ground nodes G11~G13 in the on-chip network 510, and three second power nodes P21~P23 and three second ground nodes G21~G23 in the off-chip network 520. Next, the signal analyzing method assigns the first ground node G11 as a first reference node R1, and the second ground node G21 as a second reference node R2. Next, the signal analyzing method utilizes a full wave electromagnetic simulation to analyze the off-chip network 520, thereby obtaining five first resultant nodes N11~N15 in the on-chip network 510 and five second resultant nodes N21~N25 in the off-chip network 520, wherein the first resultant node N11 is derived from a voltage difference between the first reference node R1 and the first power node P11; the first resultant node N12 is derived from a voltage difference between the first reference node R1 and the first power node P12; the first resultant node N13 is derived from a voltage difference between the first reference node R1 and the first power node P13; the first resultant node N14 is derived from a voltage difference between the first reference node R1 and the first ground node G12; the first resultant node N15 is derived from a voltage difference between the first reference node R1 and the first ground node G13; the second resultant node N21 is derived from a voltage difference between the second reference node R2 and the second power node P21; the second resultant node N22 is derived from a voltage difference between the second reference node R2 and the second power node P22; the second resultant node N23 is derived from a voltage difference between the second reference node R2 and the second power node P23; the second resultant node N24 is derived from a voltage difference between the second reference node R2 and the second ground node G22; and the second resultant node N25 is derived from a voltage difference between the second reference node R2 and the second ground node G23. Next, the signal analyzing method maps the second resultant nodes N21~N25 in the off-chip network 520 with the first resultant nodes N11~N15 in the on-chip network 510.

Please note that the above embodiment is only for illustrative purposes and is not meant to be limitations of the present invention. Compared with the conventional signal analyzing method for an electronic device having an on-chip network and an off-chip network, the signal analyzing method disclosed by the present invention is able to provide a complete electrical connection and accurate electrical characteristics between two different interfaces for an electronic device having an on-chip network and an off-chip network.

Those skilled in the art will readily observe that numerous modifications and alterations of the device and method may be made while retaining the teachings of the invention.

What is claimed is:

1. A signal analyzing method for an electronic device having an on-chip network and an off-chip network, comprising:
   defining a number X of first power nodes and a number Y of first ground nodes in the on-chip network, wherein X and Y are positive integers;
   defining a number X of second power nodes and a number Y of second ground nodes in the off-chip network;
   assigning one of the first ground nodes as a first reference node;
   assigning one of the second ground nodes as a second reference node;
   utilizing a full wave electromagnetic simulation to analyze the off-chip network, thereby obtaining a number (X+Y−1) of first resultant nodes in the on-chip network and a number (X+Y−1) of second resultant nodes in the off-chip network, wherein each of the first resultant nodes is derived from a voltage difference between the first reference node and a corresponding node selected from the first power nodes and the first ground nodes except the first reference node, and each of the second resultant nodes is derived from a voltage difference between the second reference node and a corresponding node selected from the second power nodes and the second ground nodes except the second reference node; and
   mapping the second resultant nodes in the off-chip network with the first resultant nodes in the on-chip network.

2. The signal analyzing method of claim 1, wherein the on-chip network is an integrated circuit (IC), and the off-chip network is a circuit board.

\* \* \* \* \*